US012651728B2

(12) United States Patent
Hudson

(10) Patent No.: US 12,651,728 B2
(45) Date of Patent: Jun. 9, 2026

(54) PASSIVATION CHEMISTRY FOR PLASMA ETCHING

(71) Applicant: Lam Research Corporation, Fremont, CA (US)

(72) Inventor: Eric A. Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 498 days.

(21) Appl. No.: 18/003,138

(22) PCT Filed: Sep. 17, 2021

(86) PCT No.: PCT/US2021/050985
    § 371 (c)(1),
    (2) Date: Dec. 22, 2022

(87) PCT Pub. No.: WO2022/072160
    PCT Pub. Date: Apr. 7, 2022

(65) Prior Publication Data
    US 2023/0335378 A1      Oct. 19, 2023

Related U.S. Application Data

(60) Provisional application No. 62/706,923, filed on Sep. 18, 2020.

(51) Int. Cl.
    *H01J 37/32*        (2006.01)
    *H10P 50/26*        (2026.01)
    *H10P 50/28*        (2026.01)

(52) U.S. Cl.
    CPC ...... *H01J 37/32449* (2013.01); *H10P 50/267* (2026.01); *H10P 50/283* (2026.01); *H01J 2237/2001* (2013.01); *H01J 2237/334* (2013.01)

(58) Field of Classification Search
    None
    See application file for complete search history.

(56) References Cited

U.S. PATENT DOCUMENTS 4,374,698 A      2/1983  Sanders et al.
4,431,477 A      2/1984  Zajac
        (Continued)

FOREIGN PATENT DOCUMENTS

CN      1369021 A      9/2002
CN      101752291 A    6/2010
        (Continued)

OTHER PUBLICATIONS

Blain et al. (Jul./Aug. 1996) "Role of nitrogen in the downstream etching of silicon nitride," Journal of Vacuum Science & Technology A, 14(4):2151-2157.
        (Continued)

*Primary Examiner* — Stephanie P Duclair
(74) *Attorney, Agent, or Firm* — Weaver Austin Villeneuve & Sampson LLP

(57)         ABSTRACT

Various embodiments herein relate to methods and apparatus for etching a recessed feature in a material on a substrate. For example, the methods may include (a) flowing a gas mixture into a processing chamber, where the gas mixture includes an etch component and a passivation component, and where the passivation component includes particular elements and/or species and/or is provided under particular conditions; (b) generating a plasma from the gas mixture in the processing chamber; and (c) exposing the substrate to the plasma and etching the recessed feature in the material on the substrate. In many cases, the material being etched on the substrate includes dielectric material and/or an electrically conductive material.

7 Claims, 5 Drawing Sheets

(56) References Cited

U.S. PATENT DOCUMENTS

| | | | |
|---|---|---|---|
| 4,793,897 | A | 12/1988 | Dunfield et al. |
| 4,820,378 | A | 4/1989 | Loewenstein |
| 4,938,992 | A | 7/1990 | Mears |
| 5,180,466 | A | 1/1993 | Shin |
| 5,556,501 | A | 9/1996 | Collins et al. |
| 5,683,538 | A | 11/1997 | O'Neill et al. |
| 5,888,414 | A | 3/1999 | Collins et al. |
| 6,024,826 | A | 2/2000 | Collins et al. |
| 6,048,435 | A | 4/2000 | DeOrnellas et al. |
| 6,060,400 | A | 5/2000 | Oehrlein et al. |
| 6,071,822 | A * | 6/2000 | Donohue ............ B81C 1/00571 |
| | | | 438/719 |
| 6,074,514 | A | 6/2000 | Bjorkman et al. |
| 6,074,959 | A | 6/2000 | Wang et al. |
| 6,313,042 | B1 | 11/2001 | Cohen et al. |
| 6,376,386 | B1 | 4/2002 | Oshima |
| 6,406,924 | B1 | 6/2002 | Grimbergen et al. |
| 6,461,529 | B1 | 10/2002 | Boyd et al. |
| 6,638,855 | B1 | 10/2003 | Chang et al. |
| 6,962,879 | B2 | 11/2005 | Zhu et al. |
| 7,129,171 | B2 | 10/2006 | Zhu et al. |
| 7,288,482 | B2 | 10/2007 | Panda et al. |
| 7,309,646 | B1 | 12/2007 | Heo et al. |
| 7,338,907 | B2 | 3/2008 | Li et al. |
| 7,767,024 | B2 | 8/2010 | Kao et al. |
| 8,440,572 | B2 | 5/2013 | Honda |
| 8,679,982 | B2 | 3/2014 | Wang et al. |
| 8,679,983 | B2 | 3/2014 | Wang et al. |
| 8,889,024 | B2 | 11/2014 | Watanabe et al. |
| 8,916,477 | B2 | 12/2014 | Thedjoisworo et al. |
| 8,956,980 | B1 | 2/2015 | Chen et al. |
| 8,969,212 | B2 | 3/2015 | Ren et al. |
| 9,034,773 | B2 | 5/2015 | Thedjoisworo et al. |
| 9,111,877 | B2 | 8/2015 | Chen et al. |
| 9,202,708 | B1 | 12/2015 | Chen et al. |
| 9,236,266 | B2 | 1/2016 | Zhang et al. |
| 9,318,343 | B2 | 4/2016 | Ranjan et al. |
| 9,330,926 | B2 | 5/2016 | Chebi et al. |
| 9,558,928 | B2 | 1/2017 | Thedjoisworo et al. |
| 9,595,451 | B1 | 3/2017 | Zhou et al. |
| 9,613,822 | B2 | 4/2017 | Chen et al. |
| 9,640,409 | B1 | 5/2017 | Yang et al. |
| 9,911,620 | B2 | 3/2018 | Zhu et al. |
| 10,283,615 | B2 | 5/2019 | Yang et al. |
| 10,861,693 | B2 | 12/2020 | Stone et al. |
| 2002/0045355 | A1 | 4/2002 | Chong et al. |
| 2002/0132422 | A1 | 9/2002 | Ranade et al. |
| 2002/0160125 | A1 | 10/2002 | Johnson et al. |
| 2002/0175144 | A1 | 11/2002 | Hung et al. |
| 2002/0185469 | A1 | 12/2002 | Podlesnik et al. |
| 2003/0045098 | A1 | 3/2003 | Verhaverbeke et al. |
| 2003/0098288 | A1 | 5/2003 | Mori et al. |
| 2003/0186545 | A1 | 10/2003 | Kamp et al. |
| 2004/0018741 | A1 | 1/2004 | Deshmukh et al. |
| 2004/0195216 | A1 | 10/2004 | Strang |
| 2004/0224264 | A1 | 11/2004 | Xiao et al. |
| 2005/0022839 | A1 | 2/2005 | Savas et al. |
| 2005/0133164 | A1 | 6/2005 | Fischer et al. |
| 2005/0142734 | A1 | 6/2005 | Shin |
| 2005/0155625 | A1 | 7/2005 | Jangjian et al. |
| 2007/0119545 | A1 | 5/2007 | Del Puppo et al. |
| 2007/0184640 | A1 | 8/2007 | Lee et al. |
| 2007/0202700 | A1 | 8/2007 | Leucke et al. |
| 2008/0038927 | A1 | 2/2008 | Yamaguchi et al. |
| 2008/0268645 | A1 | 10/2008 | Kao et al. |
| 2009/0184089 | A1 | 7/2009 | Chebi et al. |
| 2009/0191714 | A1 | 7/2009 | Lai et al. |
| 2009/0221117 | A1 | 9/2009 | Tan et al. |
| 2009/0246965 | A1 | 10/2009 | Mori et al. |
| 2010/0003827 | A1 | 1/2010 | Kessels et al. |
| 2010/0178770 | A1 | 7/2010 | Zin |
| 2010/0203739 | A1 | 8/2010 | Becker et al. |
| 2010/0248487 | A1 | 9/2010 | Lee et al. |
| 2011/0143548 | A1 | 6/2011 | Cheung et al. |
| 2011/0294300 | A1 | 12/2011 | Zhang et al. |

| | | | |
|---|---|---|---|
| 2012/0149213 | A1 | 6/2012 | Nittala et al. |
| 2012/0238102 | A1 | 9/2012 | Zhang et al. |
| 2013/0012026 | A1 | 1/2013 | Fuller et al. |
| 2013/0029494 | A1 | 1/2013 | Sasaki et al. |
| 2013/0089988 | A1 | 4/2013 | Wang et al. |
| 2013/0298942 | A1 | 11/2013 | Ren et al. |
| 2013/0309416 | A1 | 11/2013 | Yokoyama et al. |
| 2014/0004707 | A1 | 1/2014 | Thedjoisworo et al. |
| 2014/0004708 | A1 | 1/2014 | Thedjoisworo et al. |
| 2014/0054269 | A1 | 2/2014 | Hudson et al. |
| 2014/0080308 | A1 | 3/2014 | Chen et al. |
| 2014/0141621 | A1 | 5/2014 | Ren et al. |
| 2014/0166617 | A1 | 6/2014 | Chen et al. |
| 2014/0220785 | A1 | 8/2014 | Watanabe et al. |
| 2014/0248780 | A1 | 9/2014 | Ingle et al. |
| 2014/0262038 | A1 | 9/2014 | Wang et al. |
| 2015/0064919 | A1 | 3/2015 | Kim et al. |
| 2015/0075715 | A1 | 3/2015 | Thedjoisworo et al. |
| 2015/0079797 | A1 | 3/2015 | Chen et al. |
| 2015/0214474 | A1 | 7/2015 | Nishimura et al. |
| 2016/0042968 | A1 | 2/2016 | Purayath et al. |
| 2016/0043099 | A1 | 2/2016 | Purayath et al. |
| 2016/0064212 | A1 | 3/2016 | Thedjoisworo et al. |
| 2016/0064519 | A1 | 3/2016 | Yang et al. |
| 2016/0093505 | A1 | 3/2016 | Chen et al. |
| 2016/0181116 | A1 | 6/2016 | Berry, III et al. |
| 2016/0247688 | A1 | 8/2016 | Zhu et al. |
| 2016/0260616 | A1 | 9/2016 | Li et al. |
| 2016/0293440 | A1 | 10/2016 | Nagatomo et al. |
| 2016/0300725 | A1 | 10/2016 | Ambati et al. |
| 2017/0076945 | A1* | 3/2017 | Hudson ............... H01J 37/3244 |
| 2017/0103873 | A1 | 4/2017 | Kawasaki |
| 2017/0110335 | A1 | 4/2017 | Yang et al. |
| 2017/0133233 | A1 | 5/2017 | Sato et al. |
| 2017/0207099 | A1 | 7/2017 | Ohtake et al. |
| 2017/0222139 | A1 | 8/2017 | Nishimura et al. |
| 2018/0151435 | A1 | 5/2018 | Chiang et al. |
| 2018/0286707 | A1 | 10/2018 | Hudson et al. |
| 2018/0327913 | A1 | 11/2018 | Lansalot-Matras et al. |
| 2019/0221654 | A1 | 7/2019 | Yang et al. |
| 2019/0242019 | A1* | 8/2019 | Blomberg .............. C09K 13/00 |
| 2019/0341268 | A1 | 11/2019 | Zhang et al. |
| 2019/0393047 | A1 | 12/2019 | Dole et al. |
| 2020/0051807 | A1 | 2/2020 | Singhal et al. |
| 2020/0126804 | A1 | 4/2020 | Dole et al. |
| 2021/0051792 | A1 | 2/2021 | Dokan et al. |
| 2021/0143016 | A1 | 5/2021 | Yokoyama et al. |
| 2023/0127597 | A1 | 4/2023 | Takahashi et al. |
| 2024/0420963 | A1 | 12/2024 | Zhang et al. |

FOREIGN PATENT DOCUMENTS

| | | |
|---|---|---|
| CN | 102741987 A | 10/2012 |
| CN | 103430289 A | 12/2013 |
| CN | 103779203 A | 5/2014 |
| CN | 103843117 A | 6/2014 |
| EP | 0424299 A2 | 4/1991 |
| EP | 0424299 A3 | 8/1991 |
| EP | 0658928 A1 | 6/1995 |
| EP | 0838842 A2 | 4/1998 |
| EP | 0552491 B1 | 7/1998 |
| JP | H11260913 A | 9/1999 |
| JP | 2000236021 A | 8/2000 |
| JP | 2001144028 A | 5/2001 |
| JP | 2001244214 A | 9/2001 |
| JP | 2003309083 A | 10/2003 |
| JP | 2005530345 A | 10/2005 |
| JP | 2014017406 A | 1/2014 |
| JP | 2017163032 A | 9/2017 |
| JP | 2019502253 A | 1/2019 |
| JP | 2019145780 A | 8/2019 |
| KR | 20080061930 A | 7/2008 |
| KR | 20100078965 A | 7/2010 |
| KR | 20120120400 A | 11/2012 |
| KR | 20130047663 A | 5/2013 |
| KR | 20180067667 A | 6/2018 |
| KR | 20190098922 A | 8/2019 |
| TW | 483103 B | 4/2002 |
| TW | 200607017 A | 2/2006 |

(56) References Cited

FOREIGN PATENT DOCUMENTS

| | | | |
|---|---|---|---|
| TW | 200739715 | A | 10/2007 |
| TW | 201201275 | A | 1/2012 |
| TW | 201207934 | A | 2/2012 |
| TW | 201541553 | A | 11/2015 |
| TW | 201802938 | A | 1/2018 |
| WO | WO-0014793 | A2 | 3/2000 |
| WO | WO-0040776 | A1 | 7/2000 |
| WO | WO-0112873 | A1 | 2/2001 |
| WO | WO-2011051251 | A1 | 5/2011 |
| WO | WO-2019138654 | A1 | 7/2019 |
| WO | WO-2019235398 | A1 | 12/2019 |
| WO | WO-2020055837 | A1 | 3/2020 |

OTHER PUBLICATIONS

Blain (Mar./Apr. 1999) "Mechanism of nitrogen removal from silicon nitride by nitric oxide," Journal of Vacuum Science & Technology A, 17(2):665-667.
Chinese First Office Action dated Aug. 22, 2017 issued in Application No. CN 201510543852.X.
Chinese First Office Action dated Jul. 17, 2019 issued in Application No. CN 201610996940.X.
Chinese First Office Action dated Mar. 22, 2018 issued in CN 201610099255.7.
Chinese First Office Action dated Nov. 30, 2017 issued in CN 201510957911.8.
Chinese Second Office Action dated Feb. 25, 2020 issued in Application No. Cn 201610996940.X.
Chinese Second Office Action dated Jul. 25, 2018 issued in CN 201510957911.8.
Chinese Third Office Action dated Mar. 18, 2019 issued in CN 201510957911.8.
European Extended Search Report dated May 30, 2016 issued in EP 15 199 363.1.
International Preliminary Report on Patentability dated Oct. 13, 2022, in PCT Application No. PCT/US2021/021752.
International Search Report and Written Opinion dated Jun. 29, 2021, in PCT Application No. PCT/US2021/021752.
International Preliminary Report on Patentability dated Mar. 30, 2023, in PCT Application No. PCT/US2021/050985.
International Search Report and Written Opinion dated Jun. 7, 2022, in PCT Application No. PCT/US2021/050985.
International Search Report and Written Opinion dated Mar. 10, 2023 from PCT/US2022/079143.
Japanese First Office Action dated Jun. 5, 2019 issued in Application No. JP 2015-167336.
Kastenmeier et al. (Nov./Dec. 1999) "Highly selective etching of silicon nitride over silicon and silicon dioxide," J. Vac. Sci. Technol. A, American Vacuum Society, 17(6):3179-3184.
Kastenmeier et al. (Sep./Oct. 1996) "Chemical dry etching of silicon nitride and silicon dioxide using CF4/O2/N2 gas mixtures," J. Vac. Sci. Technol. A 14(5):2802-2813.
Korean First Office Action dated Nov. 27, 2019 issued in Application No. KR 10-2013- 0076689.
KR Office Action dated Feb. 28, 2022, in Application No. KR1020150121582 with English translation.
KR Office Action dated Nov. 28, 2022 in Application No. KR10-2016-0020748 with English translation.
KR Office Action dated Sep. 7, 2023, in Application No. KR10-2016-0020748 with English Translation.
Nishino et al. (1993) "Damage-free selective etching of Si native oxides using NH3/NF3 and SF6/H2O down-flow etching," J. Appl. Phys. 74(2):1345-1348.
Oehrlein et al. (1996) "Study of plasma-surface interactions: chemical dry etching and high-density plasma etching," Plasma Sources Sci. Technol. 5:193-199.
Sidhwa, A.J. et al., "Reactive ion etching of crystalline silicon using $NF_3$ diluted with $H_2$", Journal of Vacuum Science & Technology A, 1993, vol. 11, No. 4, pp. 1156-1160.

Singapore Search Report and Written Opinion dated Jun. 18, 2018 issued in SG 10201601329U.
Singapore Written Opinion dated May 7, 2019 issued in SG 10201601329U.
Taiwan First Office Action dated Dec. 25, 2018 issued in Application No. TW 104128251.
Taiwan Office Action and Search Report dated Nov. 22, 2016 issued in Application No. TW 102123510.
Taiwanese First Office Action dated Jun. 8, 2020 issued in Application No. TW 105136072.
Tajima et al. (2013) "Room-Temperature Si Etching in NO/F2 Gases and the Investigation of Surface Reaction Mechanisms," The Journal of Physical Chemistry C, 117:5118-5125.
U.S Advisory Action dated May 25, 2016 in U.S. Appl. No. 14/576,020.
US Final Office Action dated Apr. 18, 2019 issued in U.S. Appl. No. 15/878,335.
US Final Office Action dated Feb. 26, 2016 issued in U.S. Appl. No. 14/576,020.
US Final Office Action dated Feb. 3, 2017 issued in U.S. Appl. No. 14/676,710.
US Final Office Action dated May 11, 2017 issued in U.S. Appl. No. 14/576,020.
U.S. Final Office Action, dated Nov. 6, 2014, issued in U.S. Appl. No. 13/916,497.
U.S. Notice of Allowance dated Dec. 28, 2018 issued in U.S. Appl. No. 14/938,635.
U.S. Notice of Allowance, dated Feb. 13, 2015, issued in U.S. Appl. No. 13/916,497.
U.S. Notice of Allowance, dated Nov. 16, 2016, issued in U.S. Appl. No. 14/547,974.
US Notice of Allowance dated Oct. 23, 2017 issued in U.S. Appl. No. 14/676,710.
U.S. Notice of Allowance, dated Sep. 11, 2014, issued in U.S. Appl. No. 13/916,387.
U.S. Notice of Allowance, dated Sep. 27, 2016, issued in U.S. Appl. No. 14/577,977.
US Office Action dated Aug. 11, 2016 issued in U.S. Appl. No. 14/676,710.
U.S. Office Action, dated Jun. 1, 2018 issued in U.S. Appl. No. 14/938,635.
US Office Action dated Jun. 26, 2017 issued in U.S. Appl. No. 14/676,710.
U.S. Office Action dated Jun. 27, 2019 issued in U.S. Appl. No. 16/364,797.
U.S. Office Action, dated Mar. 17, 2017, issued in U.S. Appl. No. 14/547,974.
U.S. Office Action, dated May 27, 2016, issued in U.S. Appl. No. 14/577,977.
U.S. Office Action, dated May 30, 2014, issued in U.S. Appl. No. 13/916,497.
U.S. Office Action, dated May 7, 2014, issued in U.S. Appl. No. 13/916,387.
US Office Action dated Oct. 5, 2015 issued in U.S. Appl. No. 14/576,020.
US Office Action dated Sep. 10, 2018 issued in U.S. Appl. No. 15/878,335.
US Office Action dated Sep. 23, 2016 issued in U.S. Appl. No. 14/576,020.
Wolf, Stanley, Ph.D., (2002) "Silicon Processing for the VLSI Era," Lattice Press, Sunset Beach, 4:Chapter 3, p. 75.
Yun et al. (2007) "Large Etch Rate Enhancement by NO-Induced Surface Chemical Reaction during Chemical Dry Etching of Silicon Oxide in F2 Remote Plasmas" Journal of The Elctrochemical Society, vol. 154, No. 4, pp. D267-D272.
International Preliminary Report on Patentability and Written Opinion dated May 16, 2024 in PCT Application No. PCT/US2022/079143.
JP Office Action dated Jan. 7, 2025 in JP Application No. 2022-559559 with English translation.
TW Office Action dated Jul. 31, 2024 in TW Application No. 110111113 with English translation.

(56) References Cited

OTHER PUBLICATIONS

U.S. Non-Final Office Action dated Nov. 5, 2024 in U.S. Appl. No. 17/907,401.

U.S. Restriction requirement dated Aug. 29, 2024 in U.S. Appl. No. 17/907,401.

JP Office Action dated May 7, 2025 in JP Application No. 2023-517844, with English Translation.

KR Office Action dated Jun. 5, 2025 in KR Application No. 10-2022-7037978, with English Translation.

U.S. Final Office Action dated May 20, 2025 in U.S. Appl. No. 17/907,401.

KR Office Action dated Oct. 22, 2025 in KR Application No. 10-2022-7046069, with English Translation.

* cited by examiner

FIG. 1A                    FIG. 1B

PASSIVATION CHEMISTRY FOR PLASMA ETCHING

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

FIELD

The embodiments described in the present disclosure relate to chemistry that may be used while etching recessed features on a substrate, as well as methods, apparatus, and systems for performing such etching.

BACKGROUND

As semiconductor device dimensions continue to shrink, fabrication of such devices becomes increasingly difficult. One process commonly involved with semiconductor fabrication is the formation of recessed features on a semiconductor substrate. In many cases, the features are formed in dielectric material, and/or in a stack that includes dielectric material.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Various embodiments herein relate to methods, apparatus, and systems for etching recessed features into material on semiconductor substrates. In one aspect of the embodiments herein, a method of etching a recessed feature into a material on a substrate in a processing chamber is provided, the method including: (a) flowing a gas mixture into the processing chamber, where the gas mixture includes an etch component and a passivation component, where one or more of the following conditions is satisfied: (i) the passivation component includes an element selected from the group consisting of rhenium, lead, nickel, zinc, gallium, vanadium, germanium, arsenic, antimony, tellurium, selenium, and combinations thereof, (ii) the passivation component includes $Sn(CH_3)_4$ and/or $SnH_4$, (iii) the passivation component includes $MoF_6$ and/or $MoCl_2F_2$, (iv) the passivation component includes $WOCl_4$, bis(t-butylimido)bis(dimethylamino)tungsten(VI) $(((CH_3)_3CN)_2W(N(CH_3)_2)_2)$, mesitylene tungsten tricarbonyl $(C_6H_3(CH_3)_3W(CO)_3)$, $WOF_4$, $WO_2F_2$, and/or $WO_2Cl_2$, and/or (v) the substrate is positioned on a substrate support during etching, the substrate support is maintained at a temperature of about $-10°$ C. or warmer during etching, and the passivation component includes an element selected from the group consisting of molybdenum, tin, titanium, tantalum, and combinations thereof; (b) generating a plasma from the gas mixture in the processing chamber; and (c) exposing the substrate to the plasma and etching the recessed feature into the material on the substrate.

In some embodiments, the passivation component is stored as a gas or a liquified gas. In other embodiments, the passivation component is stored as a liquid, and the method further includes vaporizing the passivation component prior to flowing the gas mixture into the processing chamber. In various cases, the etch component and the passivation component are mixed together before delivery to the processing chamber.

Many different chemical species are available for the passivation component, and they may be provided separately or together as desired for a particular application. In many embodiments, the passivation component includes one or more particular elements and/or chemical species. The element may be provided in the form of one or more chemical species mentioned herein, or in other species that include the relevant element. For example, in some cases, the passivation component includes rhenium. In some such cases, the passivation component may include $ReF_6$. In some cases, the passivation component includes lead. In some such cases, the passivation component includes $PbH_4$ and/or $Pb(C_2H_5)_4$. In some cases, the passivation component includes nickel. In some such cases, the passivation component includes $Ni(CO)_4$. In some cases, the passivation component includes zinc. In some such cases, the passivation component includes $Zn(CH_3)_2$. In some cases, the passivation component includes gallium. In some such cases, the passivation component includes $Ga(CH_3)_3$. In some cases, the passivation component includes vanadium. In some such cases, the passivation component includes $VF_5$ and/or $VOCl_3$. In some cases, the passivation component includes germanium. In some such cases, the passivation component includes $GeH_4$, $GeF_4$, $Ge(CH_3)_4$, and/or $GeCl_4$. In some cases, the passivation component includes arsenic. In some such cases, the passivation component includes $As(CH_3)_3$, $AsH_3$, and/or $AsCl_3$.

In some cases, the passivation component includes antimony. In some such cases, the passivation component includes $SbH_3$, $SbCl_3$, and/or $SbCl_5$. In some cases, the passivation component includes tellurium. In some such cases, the passivation component includes $H_2Te$. In some cases, the passivation component includes selenium. In some such cases, the passivation component includes $Se(CH_3)_2$, $SeF_6$, and/or $Se_2Cl_2$. In some cases, passivation component includes $MoF_6$ and/or $MoCl_2F_2$. In some cases, the passivation component includes $Sn(CH_3)_4$ and/or $SnH_4$. In some cases, the passivation component includes $W(Cl_4$, bis(t-butylimido)bis(dimethylamino)tungsten(VI) $(((CH_3)_3CN)_2W(N(CH_3)_2)_2)$, mesitylene tungsten tricarbonyl $(C_6H_3(CH_3)_3W(CO)_3)$, $WOF_4$, $WO_2F_2$, and/or $WO_2Cl_2$.

In some cases, particular reaction conditions may be controlled. For example, in some cases, the substrate support is maintained at a temperature of about $-10°$ C. or warmer during etching, and the passivation component includes an element selected from the group consisting of molybdenum, tin, titanium, tantalum, and combinations thereof. For instance, in some cases the passivation component includes tin. In some such cases, the passivation component includes $SnH_4$, $SnCl_4$, and/or $Sn(CH_3)_4$. In some cases the passivation component includes molybdenum. For instance, in some cases the passivation component includes $MoF_6$ and/or $MoCl_2F_2$. In some cases, the passivation component includes titanium. For instance, in some cases the passivation component includes $TiCl_4$. In some cases, the passivation component includes tantalum. For instance, in some cases the passivation component includes $TaF_5$.

In various embodiments, the material on the substrate includes dielectric material, and (c) includes etching the recessed feature into the dielectric material. In these or other embodiments, the material on the substrate may include an electrically conductive material, and (c) may include etching the recessed feature into the electrically conductive material.

In a further aspect of the disclosed embodiments, an apparatus for etching a substrate is provided, the apparatus including: a processing chamber; a plasma generator; and a controller configured to cause any of the methods claimed or otherwise described herein.

These and other features will be described below with reference to the associated drawings.

BRIEF DESCRIPTION OF THE DRAWINGS

FIGS. 1A-1C illustrate a problem that can arise during etching when there is insufficient selectivity between the mask and the material being etched.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

I. Technology for Etching High Aspect Ratio Features

Fabrication of certain semiconductor devices involves etching features into one or more materials provided on a substrate. The material may be a single layer of material, a stack of materials, or one or more layers within a stack of materials. In some cases, a stack includes alternating layers of dielectric material (e.g., silicon nitride and silicon oxide), or alternating layers of dielectric material and a second material (e.g., silicon oxide and polysilicon). In some cases, the material being etched is electrically conductive. One example etched feature is a cylinder, which may have a high aspect ratio. Another example etched feature is a trench, which may similarly have a high aspect ratio. As the aspect ratio of such features continues to increase, it is ever more challenging to etch the features into the relevant substrate material.

In order to etch high aspect ratio features on a substrate, the substrate is first prepared as desired for a particular application. This may involve depositing one or more layers of dielectric material onto the substrate. Such dielectric layer(s) include the layer(s) in which the feature will be etched. After the dielectric material is deposited on the substrate, a mask layer is deposited and then patterned on the substrate. The patterned mask layer serves to define where the features are etched on the substrate. Notably, features will be etched in areas where the mask layer has been removed. By contrast, areas where the mask remains will be protected during the etch. In some cases, the etching methods described herein may be used after the mask is patterned/etched, to thereby etch the materials positioned under the mask. In some cases, the etching methods described herein may be used in a mask open operation to etch the mask itself.

Figure 1C:
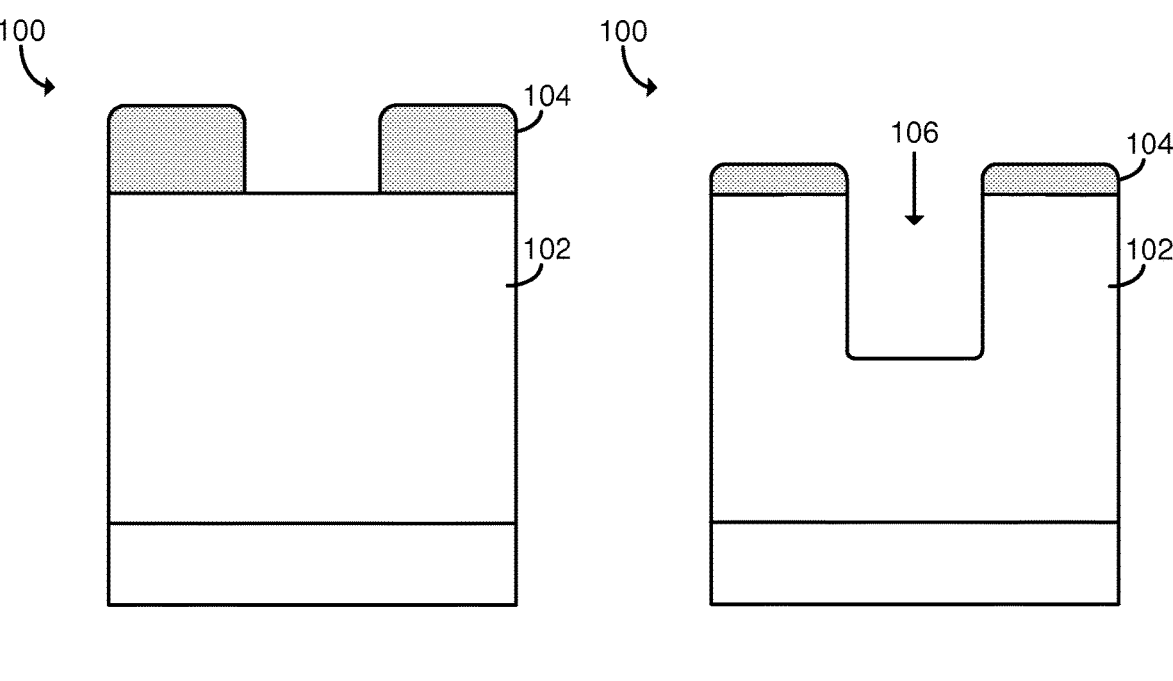
Figure 1C:
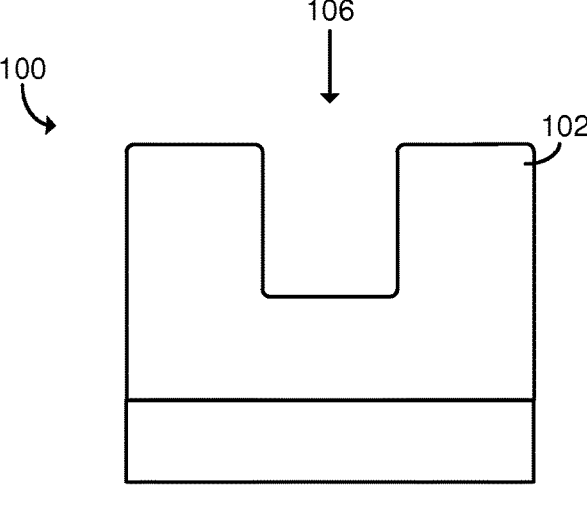

FIGS. 1A-1 C together illustrate one challenge that can arise during etching of high aspect ratio features. FIG. 1A depicts a substrate 100 prior to etching. The substrate 100 has dielectric material 102 and mask 104 thereon. The dielectric material 102 may include one or more layers of silicon oxide and silicon nitride. In a particular example, the dielectric material 102 includes alternating layers of silicon oxide and silicon nitride. Other layers and/or structures may also be present in some cases. The mask 104 may be an ashable hardmask material, such as amorphous carbon. Other types of mask materials may be used as appropriate for a particular application. As shown in FIG. 1A, the mask 104 has been patterned. FIG. 1B illustrates the substrate 100 as feature 106 is etched into the dielectric material 102. As described above, the feature 106 forms in areas where mask 104 is absent. However, the mask 104 is substantially eroded during etching due to the severity of the etch conditions. As such, the mask 104 in FIG. 1B is significantly thinner than the mask 104 in FIG. 1A. FIG. 1C illustrates the substrate 100 after etching (or further along in the etch compared to FIG. 113). Here, the mask 104 has completely eroded away. At this point, it is difficult or impossible to etch feature 106 any deeper, since the top portion of the dielectric material 102 is exposed to the etching conditions after mask 104 is eroded away. As such, further etching would erode both the bottom of feature 106 and the top portion of the dielectric material 102, preventing the feature 106 from becoming any deeper.

The problem shown in FIGS. 1A-IC relates to etch selectivity. Etch selectivity relates to the fact that some materials etch more quickly than others. In the context of FIGS. 1A-IC, it is desired that the dielectric material 102 is selectively etched compared to mask 104. In other words, it is desired that dielectric material 102 etches faster than mask 104.

The etch selectivity for a particular etch process and set of materials can be defined numerically as: (the thickness etched through material A)/(the thickness etched through material B). For instance, an etch process that results in etching 2 $\mu$m of dielectric material and 0.5 $\mu$m of mask is understood to have an etch selectivity of 4 (e.g., 2 $\mu$m/0.5 $\mu$m=4), which may also be represented as an etch selectivity of 4:1. When the etch selectivity is not sufficiently high, the mask layer erodes away before the feature reaches its desired final depth.

Another problem that arises during etching of high aspect ratio features is a non-uniform etching profile. In other words, the features do not etch in a straight downward or vertical direction. Instead, the sidewalls of the features are often bowed such that a middle portion of the etched feature is wider (i.e., further etched) than a top and/or bottom portion of the feature. This excessive etching near the middle portion of the features can result in compromised structural and/or electronic integrity of the remaining material. The portion of the feature that bows outwards may occupy a relatively small portion of the total feature depth, or a relatively larger portion. The portion of the feature that bows outward is where the critical dimension of the feature is at its maximum. It is generally desirable for the maximum CD of the feature to be about the same as the CD elsewhere in the feature, for example at or near the bottom of the feature. Unfortunately, bow formation is seen even at aspect ratios as low as about 5.

Because of these and other limitations, conventional etching methods are, in practice, limited to forming relatively low aspect ratio features. However, some modern applications require cylinders or other recessed features having higher aspect ratios than those that can be achieved with conventional techniques.

One strategy for forming higher aspect ratio features is to deposit liners within the features. A liner is a sidewall passivation film that is formed in a deposition-only step. The deposition-only step may be performed after the features are partially etched, and may be cycled with the etch steps. In other words, liners do not form while the features are actively being etched. The liner acts to protect the sidewalls of the features, as well as the mask, from excessive etching during a subsequent etch step. Unfortunately, liners often produce a discontinuous etch profile just below the bottom of each liner, and in many cases result in the formation of striations (e.g., vertical grooves) within the recessed features.

Another strategy for forming higher aspect ratio features is to passivate the mask and/or feature sidewalls while the features are actively being etched. In a simple form, this passivation can be achieved with fluorocarbon-based polymer material, which may build up on feature sidewalls during etching. The fluorocarbon-based polymer material may form as a result of the interaction between the substrate materials and the etch chemistry (e.g., the fluorine- and carbon-containing etch chemistry such as $CH_2F_2$ and other similar fluorine- and carbon-containing etchants). However, such fluorocarbon-based polymers that form from existing etch chemistries have proven to be insufficient for forming high aspect ratio features with the desired vertical etch profile and other desired qualities.

More recently, $WF_6$ has been tested as an additive to the etch process. The $WF_6$ acts to further passivate the feature sidewalls and mask region to prevent excessive etching in these regions. While the $WF_6$ provides some improvement in terms of etch selectivity and reduced bow formation, it also presents several problems. For example, delivery of $WF_6$ is more complex than delivery of other common processing gases. Exposure of $WF_6$ to residual moisture, or exposure of moisture to residual $WF_6$, can undesirably cause deposition of tungsten oxyfluoride solids inside the gas delivery lines. This can cause problems such as clogging of the gas delivery lines, catalytic effects, etc. Another issue with $WF_6$ is that it has a relatively high amount of fluorine, and it dissociates very efficiently in plasma to produce a relatively high concentration of fluorine radicals. This can create undesirable tradeoffs in the etch process because fluorine is a strong etchant for silicon, polymer, oxides (e.g., silicon oxide), nitrides (e.g., silicon nitride), etc. $WF_6$ can also be problematic because it has very low flow rate limitations, which are difficult to achieve/control in practice. Moreover, in certain process regimes $WF_6$ can lead to an undesirably high build-up of tungsten on feature sidewalls and/or to formation of striations (e.g., unwanted vertical grooves) within the etched features. $SF_6$ has also been shown to provide some further passivation to feature sidewalls and to the mask region in the context of fluorocarbon-based etch chemistries. However, $SF_6$ tends to attack carbon-based masks due, in part, to the high reactivity of sulfur with carbon-containing compounds.

These problems may be overcome by using an alternative passivation chemistry. In some cases, the passivation chemistry may include a metal or metalloid (or selenium) other than tungsten. In some cases, the passivation chemistry includes tungsten, and includes less fluorine than $WF_6$ (e.g., has an F:W ratio lower than 6:1). In some cases, the passivation chemistry includes tungsten, and is less volatile than $WF_6$.

The novel chemistries described herein may be used to form high aspect ratio features with desired qualities such as a high degree of etch selectivity, a strongly vertical profile, low bowing, and low degree of variability among the etched features (e.g., high hole-to-hole uniformity). For example, the chemistries described herein may operate to passivate the mask and the sidewalls of the features during the etch process to prevent excessive etching in these regions. Various chemistries described herein may provide superior passivation performance compared to other passivation chemistries such as $WF_6$ and $SF_6$. Similarly, various chemistries described herein may avoid problems associated with $WF_6$ and/or $SF_r$ passivation such as those described above.

II. Context and Applications

In various embodiments herein, features are etched in a substrate (typically a semiconductor wafer) having dielectric material on the surface, where the feature is etched into the dielectric material. However, while the embodiments herein are presented primarily in the context of dielectric etch, the disclosed techniques may also be used in other etch applications such as etching conductive materials. In one example, the techniques herein may be used in a high aspect ratio mask open operation. Regardless of the material being etched, the etching processes are generally plasma-based etching processes.

A feature is a recess in the surface of a substrate. Features can have many different shapes including, but not limited to, cylinders, ovals, rectangles, squares, other polygonal recesses, trenches, etc.

Aspect ratios are a comparison of the depth of a feature to the critical dimension of the feature (typically its width or diameter). For example, a cylinder having a depth of 2 μm and a width of 50 nm has an aspect ratio of 40:1, often stated more simply as 40. Since the feature may have a non-uniform critical dimension over the depth of the feature, the aspect ratio can vary depending on where it is measured. For instance, sometimes an etched cylinder may have a middle portion that is wider than the top and bottom portions. This wider middle section may be referred to as the bow. An aspect ratio measured based on the critical dimension at the top of the cylinder (i.e., the neck) would be higher than an aspect ratio measured based on the critical dimension at the wider middle/bow of the cylinder. As used herein, aspect ratios are measured based on the critical dimension proximate the opening of the feature, unless otherwise stated.

The features formed through the disclosed methods may be high aspect ratio features. In some applications, a high aspect ratio feature is one having an aspect ratio of at least about 5, at least about 10, at least about 20, at least about 30, at least about 40, at least about 50, at least about 60, at least about 80, or at least about 100. The critical dimension of the features formed through the disclosed methods may be about 200 nm or less, for example about 100 nm or less, about 50 nm or less, or about 20 nm or less. While the techniques described herein are particularly useful for forming high aspect ratio features, such techniques may be used for forming lower aspect ratio features, as well.

The material into which the feature is etched may be a dielectric material in various cases. Example materials include, but are not limited to, silicon oxides, silicon nitrides, silicon carbides, silicon carbo-nitrides, and laminates from any combination of these materials. Particular example materials include stoichiometric and non-stoichiometric formulations of $SiO_2$, SiN, SiC, SiCN, etc. The material or materials being etched may also include other elements, for example, hydrogen in various cases. In some embodiments, a nitride and/or oxide material being etched has a composition that includes hydrogen. As used herein, it is understood that silicon oxide materials, silicon nitride materials, etc. include both stoichiometric and non-stoichiometric versions of such materials, and that such materials may have other elements included, as described above.

One application for the disclosed methods is in the context of forming a DRAM device. In this case, the feature may be etched primarily in silicon oxide. The substrate may also include one, two, or more layers of silicon nitride, for instance. In one example, a substrate includes a silicon oxide layer sandwiched between two silicon nitride layers, with the silicon oxide layer being between about 800-1800 nm thick and one or more of the silicon nitride layers being between about 20-600 nm thick. The etched feature may be a cylinder having a final depth between about 1-3 μm, for example between about 1.5-2 m. The cylinder may have a width between about 10-50 nm, for example between about 15-30 nm. After the cylinder is etched, a capacitor memory cell can be formed therein.

Another application for the disclosed methods is in the context of forming a vertical NAND (VNAND, also referred to as 3D NAND) device. In this case, the material into which the feature is etched may have a repeating layered structure. For instance, the material may include alternating layers of oxide (e.g., $SiO_2$) and nitride (e.g., SiN), or alternating layers of oxide (e.g., $SiO_2$) and polysilicon. The alternating layers form pairs of materials. In some cases, the number of pairs may be at least about 20, at least about 30, at least about 40, at least about 60, or at least about 70. In various cases, the number of pairs may be between about 10-60 (e.g., between about 20-120 individual layers). Based on current device dimensions, the oxide layers may have a thickness between about 20-50 nm, for example between about 30-40 nm. The nitride or polysilicon layers may have a thickness between about 20-50 nm, for example between about 30-40 nm. As device dimensions continue to shrink, these layers may be thinner, for example reaching even <10 nm thickness for each layer. The feature etched into the alternating layers may have a depth between about 2-8 μm, for example between about 3-5 Lm. The feature may have a width between about 50-450 nm, for example between about 50-100 nm.

In yet other applications, the feature may be etched into a structure that includes three or more repeating layers. For instance, the structure may include alternating layers of oxide (e.g., $SiO_2$), nitride (e.g., SiN), and polysilicon.

As mentioned above, another possible application for the disclosed methods is in the context of performing a mask open step, which may be a high aspect ratio mask open step. In this case, the material into which the feature is etched is a mask material such as amorphous carbon, tungsten-doped carbon, tungsten, and/or polysilicon. The mask material may be a conductive material, rather than a dielectric material. The feature etched into the mask material may have a depth between about 0.3 and 5 μm, for example between about 0.6-4 μm. The feature may have a width between about 15-450 nm, for example between about 20-80 nm.

The dimensional/parametric details provided herein, such as high, aspect ratio, thickness, width, and depth, etc., are for example and illustration only. Based on the disclosure described herein, it should be understood that varying dimensions/parameters may also be applicable or used.

III. Etching Process

In various embodiments, the etching process is a reactive ion etch process that involves flowing a chemical etchant into a reaction chamber (often through a showerhead), generating a plasma from, inter cilia, the etchant and the relevant passivation chemistry, and exposing a substrate to the plasma. The plasma dissociates the etchant compound(s)

into neutral species and ion species (e.g., charged or neutral materials such as CF, $CF_2$ and $CF_3$). The plasma is a capacitively coupled plasma in many cases, though other types of plasma (e.g., inductively coupled plasma, microwave plasma, etc.) may be used as appropriate. Ions in the plasma are directed toward the substrate and cause the dielectric material to be etched away upon impact or through ion induced chemical reaction.

Example apparatus that may be used to perform the etching process include the FLEX™ and VANTEX™ product families of reactive ion etch reactors available from Lam Research Corporation of Fremont, CA. Appropriate apparatus are discussed further below.

As described above, issues related to etch selectivity and bow formation typically limit the maximum aspect ratio that can be achieved when etching recessed features. However, the inventors have identified certain novel chemistries that may be used during etching to enhance passivation of the feature sidewalls and mask region. These chemistries may prevent excessive etching in the sidewall and mask regions, resulting in the formation of high aspect ratio features with high quality vertical etch profiles and low hole-to-hole variability.

Figure 2:
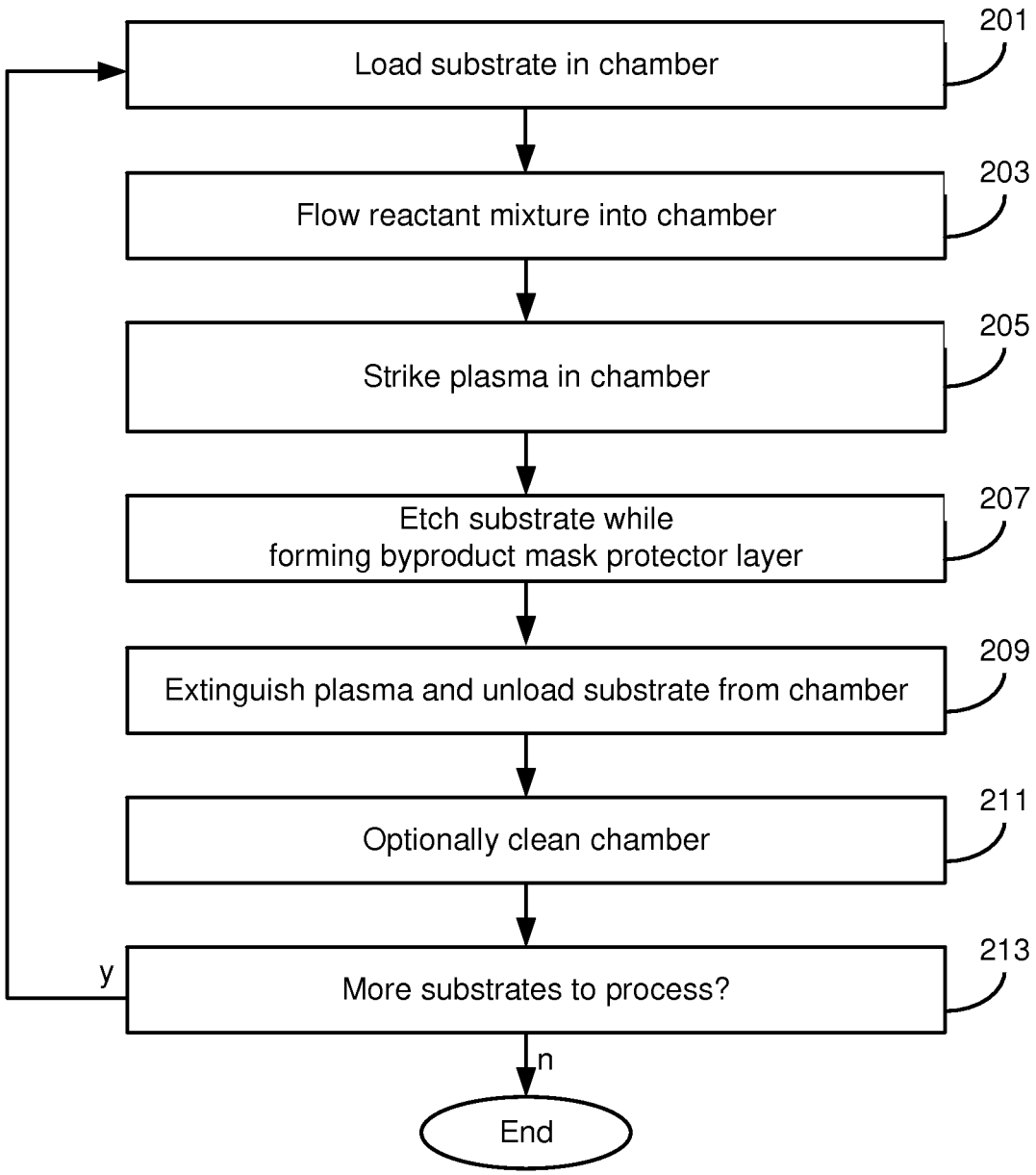
FIG. 2 is a flowchart describing a method of etching a substrate according to various embodiments.

FIG. 2 illustrates a flow chart describing a method of etching high aspect ratio features according to various embodiments herein. The method begins at operation 201, where a substrate is loaded into a reaction chamber. One example reaction chamber is described below with reference to FIGS. 3A-3C. The substrate may be loaded into a substrate support such as an electrostatic chuck in some cases. The method continues with operation 203, where a reactant mixture is flowed into the chamber. The reactant mixture may include a variety of reactants that may each serve one or more purpose. The reactant mixture includes etch chemistry, which is further discussed below. The reactant mixture also includes passivation chemistry, also described further below.

Next, at operation 205, plasma is struck in the chamber. The plasma is typically a capacitively coupled plasma, though other types of plasma may also be used. The substrate may be exposed to the plasma during operation 205. At operation 207, the substrate is etched. The substrate may be etched via ions and/or radicals in the plasma. The passivation chemistry present in the plasma operates to passivate the feature sidewalls and mask region, thus preventing these regions from becoming excessively etched as the features are etched to their final depth. Next, at operation 209, the plasma is extinguished and the substrate is unloaded from the chamber. The substrate may be subjected to further processing after removal from the reaction chamber. For example, the substrate may be transferred to an ashing reactor, where any remaining mask material may be removed from the substrate in an ashing procedure. At operation 211, the reaction chamber may be optionally cleaned. The cleaning may occur while there is no substrate present. The cleaning may involve, e.g., exposing chamber surfaces to cleaning chemistry, which may be provided in the form of plasma. At operation 213, it is determined whether there are additional substrates to process. If so, the method repeats from operation 201 on a new substrate. Otherwise, the method is complete.

The operations shown in FIG. 2 do not necessarily occur in the order shown. Some operations may overlap in time, and some operations may occur at earlier or later times compared to what is shown in the figures.

IV. Passivation Chemistry

The chemistry provided to the reaction chamber during etching includes at least etching chemistry and passivation chemistry. The etching chemistry acts to remove material from the substrate as the recessed features are being formed. The passivation chemistry acts to passivate the sidewalls of the partially etched features, as well as the mask region, to prevent these regions from being excessively etched before the feature reaches its final depth. In various embodiments, the passivation chemistry (alone or together with other species present in the processing chamber) may form a passivation layer on the feature sidewalls and mask region. The passivation layer may form over a portion of the feature depth, or over the entire feature depth. The passivation layer may operate to protect the regions it covers from the harsh etching conditions, thus preserving the mask (e.g., thereby increasing etch selectivity) and preventing bow formation within the features.

In various embodiments, the passivation chemistry includes a compound that includes at least one element selected from the group consisting of antimony, arsenic, gallium, germanium, hafnium, lead, molybdenum, nickel, rhenium, selenium, tantalum, tellurium, tin, titanium, tungsten, vanadium, and zinc. These elements can be categorized as metals (e.g., gallium, hafnium, lead, molybdenum, nickel, rhenium, tantalum, tin, titanium, tungsten, vanadium, and zinc), metalloids (e.g., antimony, arsenic, germanium, tellurium), and others (e.g., selenium).

Example antimony-containing passivation chemistry includes, but is not limited to, $SbH_3$, $SbCl_3$, and $SbCl_5$.

Example arsenic-containing passivation chemistry includes, but is not limited to, $As(CH_3)_3$, $AsH_3$, $AsCl_3$.

Example gallium-containing passivation chemistry includes, but is not limited to, $Ga(CH_3)_3$.

Example germanium-containing passivation chemistry includes, but is not limited to, $GeH_4$, $GeF_4$, $(Ge(CH_3)_4$, and $GeCl_4$.

Example lead-containing passivation chemistry includes, but is not limited to, $PbH_4$ and $Pb(C_2H_5)_4$.

Example molybdenum-containing passivation chemistry includes, but is not limited to, $MoF_6$ and $MoCl_2F_2$.

Example nickel-containing passivation chemistry includes, but is not limited to, $Ni(CO)_4$.

Example rhenium-containing passivation chemistry includes, but is not limited to, $ReF_6$.

Example selenium-containing passivation chemistry includes, but is not limited to, $Se(CH_3)_2$, $SeF_6$, and $Se_2Cl_2$.

Example tantalum-containing passivation chemistry includes, but is not limited to, $TaF_5$.

Example tellurium-containing passivation chemistry includes, but is not limited to, $H_2Te$.

Example tin-containing passivation chemistry includes, but is not limited to, $SnH_4$, $SnCl_4$, and $Sn(CH_3)_4$.

Example titanium-containing passivation chemistry includes, but is not limited to, $TiCl_4$.

Example tungsten-containing passivation chemistry includes, but is not limited to, $WCl_6$, $WBr_6$, $WF_5Cl$, $WOCl_4$, $W(CO)_6$, bis(t-butylimido)bis(dimethylamino)tungsten(VI) $(((CH_3)_3CN)_2W(N(CH_3)_2)_2)$, mesitylene tungsten tricarbonyl $(C_6H_3(CH_3)_3W(CO)_3)$, $WOF_4$, $WO_2F_2$, and $WO_2Cl_2$. In various embodiments, the tungsten-containing passivation chemistry includes a tungsten-containing species other than $WF_6$, $WCl_6$, $WBr_6$, $WF_5Cl$, and $W(CO)_6$.

Example vanadium-containing passivation chemistry includes, but is not limited to, $VF_5$ and $VOCl_3$.

Example zinc-containing passivation chemistry includes, but is not limited to, $Zn(CH_3)_2$.

The metal, metalloid, or selenium present in the passivation chemistry may be incorporated into a passivation layer that forms on the feature sidewalls and/or mask region. Further, the passivation chemistries described herein are expected to produce stable volatile molecules based on combining with other elements present in the etch chemistry such as F H, and/or O. This ensures that any residue created by the passivation chemistry (and its interaction with other chemical species) can be managed on the substrate and in the processing chamber, thus avoiding problems with wafer defectivity and/or drift in processing chamber conditions.

Some passivation chemistry is relatively more volatile, and some is relatively less volatile. The less volatile species may need to be vaporized before delivery to the processing chamber. In various examples, these less volatile species may have boiling points above about 60° C. In a number of cases where relatively less volatile passivation chemistry is used, the gas delivery system used to provide the passivation chemistry to the processing chamber may include a high temperature mass flow controller, high temperature gas lines and valves, and/or a liquid vaporization system (e.g., bubbler, liquid flow controller, vaporizer, etc.). Passivation chemistries that are relatively less volatile include, e.g., various compounds containing antimony, arsenic, gallium, germanium, hafnium, lead, molybdenum, nickel, rhenium, selenium, tantalum, tellurium, tin, titanium, vanadium, or zinc. Particular examples may include $MoCl_2F_2$, $SnCl_4$, $Sn(CH_3)_4$, $SnH_4$, $Pb(C_2H_5)_4$, $TiCl_4$, $TaF_5$, $VOCl_3$, $GeCl_4$, $AsCl_3$, $SbCl_3$, $SbCl_5$, and $Se_2Cl_2$.

Previously, it was believed that passivation chemistry should not include relatively heavy metals/metalloids/other elements because it was predicted that such elements would cause too much film buildup within features, which could lead to the features becoming clogged, undesirably narrow, or otherwise distorted.

V. Processing Conditions

One or more processing conditions may be controlled during etching. For example, the reactant mixture may be controlled. The reactant mixture includes at least the etching chemistry and the passivation chemistry. Additional species may be provided for other purposes. The etching chemistry may include one or more fluorocarbon etchant such as $CH_3F$, $CH_2F_2$, $CHF_3$, $CF_4$, $C_2F_6$, $C_3F_8$, $C_4F_6$, $C_4F_8$, $C_5F_8$, etc. The reactant mixture may include one or more non-fluorine halogen source such as HBr, $Cl_2$, $SiCl_4$, $CF_3I$, etc. The reactant mixture may include one or more inert gas (e.g., Ar, Kr, He, etc.). The reactant mixture may include hydrogen (e.g., $H_2$) and/or oxygen (e.g., $O_2$). In some cases, the reactant mixture may include one or more other additives such as $N_2$, NO, $NF_3$, $SF_6$, and/or $CH_4$. Plasma is formed from the reactant mixture, and the resulting species interact with the dielectric material to be etched.

In various embodiments, the flow rate of one or more species in the reactant mixture may be controlled. In some cases, the flow rate of H may be between about 10-400 sccm, or between about 20-400 sccm. In these or other cases, the flow rate of each fluorocarbon etchant may independently be between about 0-200 sccm, or between about 0-100 sccm. The total flow rate of all fluorocarbon etchants may be between about 10-200 sccm. In these or other cases, the flow rate of $N_2$ may be between about 0-250 sccm. In these or other cases, the flow rate of NO may be between about 0-100 sccm. In some cases, the flow rate of $NF_3$ may be between about 0-100 sccm. In these or other cases, the flow rate of $SF_6$ may be between about 0-20 sccm. In these or other cases, the flow rate of $CH_4$ may be between about 0-100 sccm. In these or other cases, the flow rate of the passivation chemistry may be between about 0.2-50 sccm. In various embodiments, the flow rate of the passivation chemistry may be at least about 0.2 sccm, at least about 0.5 sccm, at least about 1 sccm, at least about 5 sccm, or at least about 10 sccm. In these or other cases, the flow rate of the passivation chemistry may be about 50 sccm or less, about 40 sccm or less, about 30 sccm or less, about 20 sccm or less, about 10 sccm or less, about 5 sccm or less, or about 2 sccm or less.

Any of the reactants/additives described herein may be flowed at a rate of at least about 0.2 sccm, or at least about 5 sccm, or at least about 10 sccm. While many of the flow rate ranges described herein include a minimum of 0 sccm, it is understood that these species may or may not be present in the reactant mixture, and when present, they may flow at rates of at least about 0.2 sccm, or at least about 5 sccm or at least about 10 sccm.

The pressure in the reaction chamber may be controlled. In various embodiments, the pressure may be between about 5-80 mTorr, or between about 15-40 mTorr. The temperature of a substrate holder used to support the substrate within the reaction chamber may be controlled. Such substrate holder temperature affects the temperature of the substrate during etching, though the actual temperature of the substrate is also affected by additional factors such as plasma conditions. In certain implementations, the substrate holder may be cooled to a low temperature before and/or during exposure to the plasma. This low temperature may be about 0° C. or less. In some cases, this low temperature may be as low as about −100° C. In some implementations, the substrate holder may be maintained at a temperature of at least about −10° C., or at least about 0° C., or at least about 10° C. during etching. These temperatures may refer to the temperature of coolant used to cool the substrate holder. These minimum temperatures may be used with any of the passivation chemistries described herein. In some particular cases, these minimum temperatures may be used in combination with passivation chemistry that includes a compound having an element selected from the group consisting of molybdenum, tantalum, tin, and titanium.

In many embodiments, the substrate provided to the reaction chamber has a particular structure that includes dielectric material and an overlying mask, as described above in relation to FIGS. 1A-C. In various embodiments, the dielectric material may include the DRAM or 3D NAND structures described above. In various embodiments, the mask may have a thickness between about 100-5000 nm. In some cases, the mask is at least about 100 nm thick, or at least about 300 nm thick, or at least about 500 nm thick. In these or other cases, the mask may have a thickness of about 5000 nm or less, or about 800 nm or less, or about 300 nm or less. Such mask thicknesses may be appropriate for etching features having a final depth of at least about 3000 nm, or at least about 15000 nm, and/or an aspect ratio of at least about 20, or at least about 200.

The plasma generation conditions may be controlled to provide certain conditions at the substrate surface. In various embodiments, the maximum ion energy at the substrate may be relatively high, for example between about 1-10 kV. The maximum ion energy is determined by the applied RF power in combination with the details of electrode sizes, electrode placement, and chamber geometry. In various cases, dual-frequency RF power is used to generate the plasma. Thus, the RF power may include a first frequency component (e.g., about 400 kHz) and a second frequency component (e.g., about 60 MHz). Different powers may be provided at each frequency component. For instance, the first frequency component (e.g., about 400 kHz) may be provided at a power between about 3-100 kW, or between about 3-30 kW, for example about 5 kW, and the second frequency component (e.g., about 60 MHz) may be provided at a different power, for example between about 0.5-20 kW, for example about 4 kW. These power levels assume that the RF power is delivered to a single 300 mm wafer. The power levels can be scaled linearly based on substrate area for additional substrates and/or substrates of other sizes (thereby maintaining a uniform power density delivered to the substrate). In other cases, three-frequency RF power may be used to generate the plasma. In other cases, the applied RF power may be pulsed at repetition rates of 1-20000 Hz. The RF power may be pulsed between two non-zero values (e.g., between higher power and lower power states) or between zero and a non-zero value (e.g., between off and on states). Where the RF power is pulsed between two non-zero values, the powers mentioned above may relate to the higher power state, and the lower power state may correspond to an RF power of about 600 W or lower.

Timing may vary between different embodiments. Typically, features that are deeper and have higher aspect ratios take longer to etch compared to features that are shallower and have lower aspect ratios. As such, substrates having deeper features may be exposed to plasma for longer durations compared to substrates having shallower features. In various embodiments, the substrate may be exposed to plasma for a duration between about 10-120 min. Similarly, the total etch depth will depend on the particular application. For some cases (e.g., DRAM) the total etch depth may be between about 1.5-2 μm. For other cases (e.g., VNAND) the total etch depth may be at least about 3 μm, for example at least about 4 μm. In these or other cases, the total etch depth may be about 15 μm or less.

VI. Apparatus

The methods described herein may be performed by any appropriate apparatus. In various embodiments, an appropriate apparatus includes a processing chamber configured for plasma processing, and a controller configured to perform any of the methods described herein. As mentioned above, example apparatus that may be used to perform the etching processes described herein include the FLEX™ and VANTEX™ product families of reactive ion etch reactors available from Lam Research Corporation of Fremont, CA.

Figure 3A:
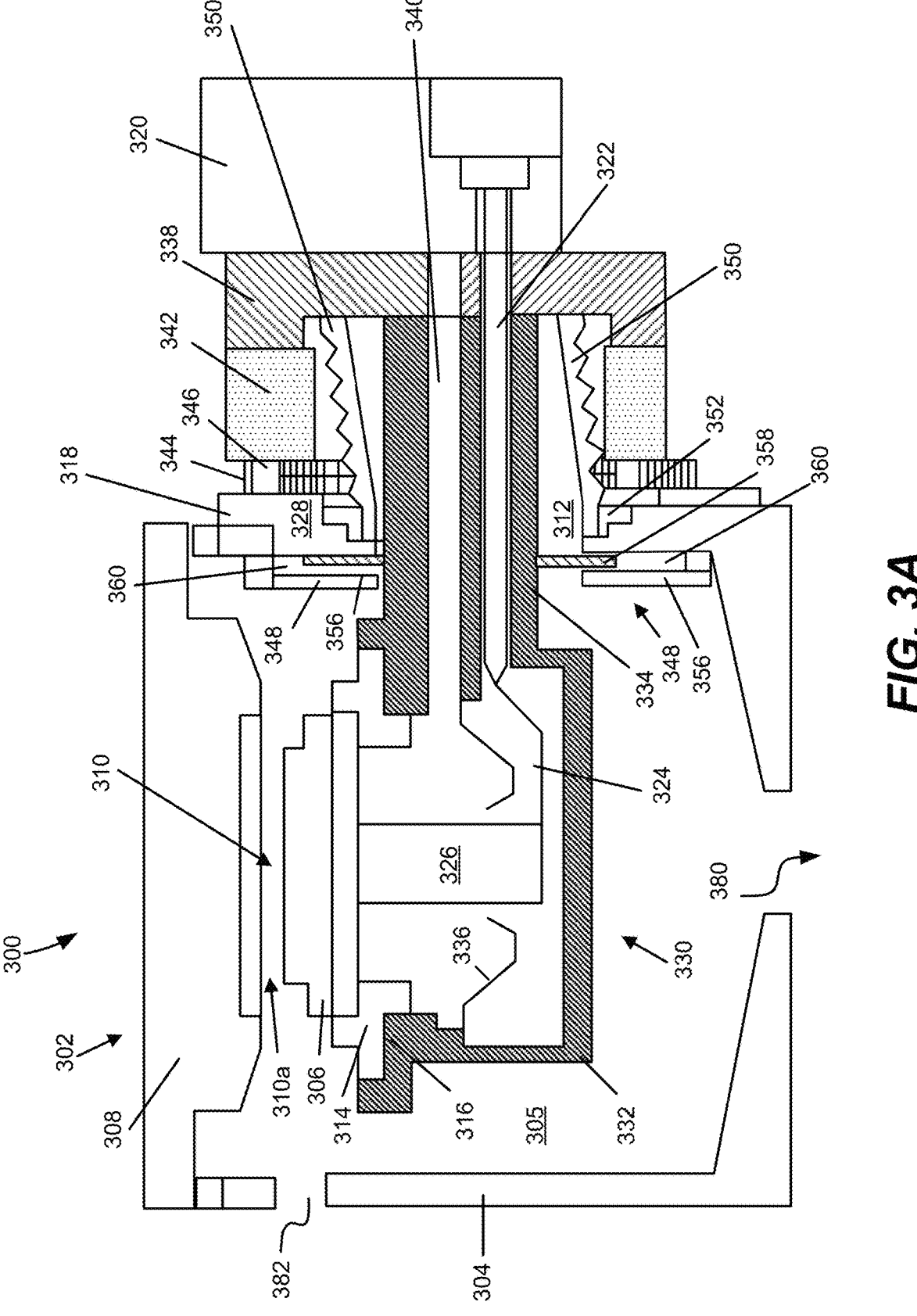
FIGS. 3A-3C depict an apparatus for plasma etching according to various embodiments.
Figure 3B:
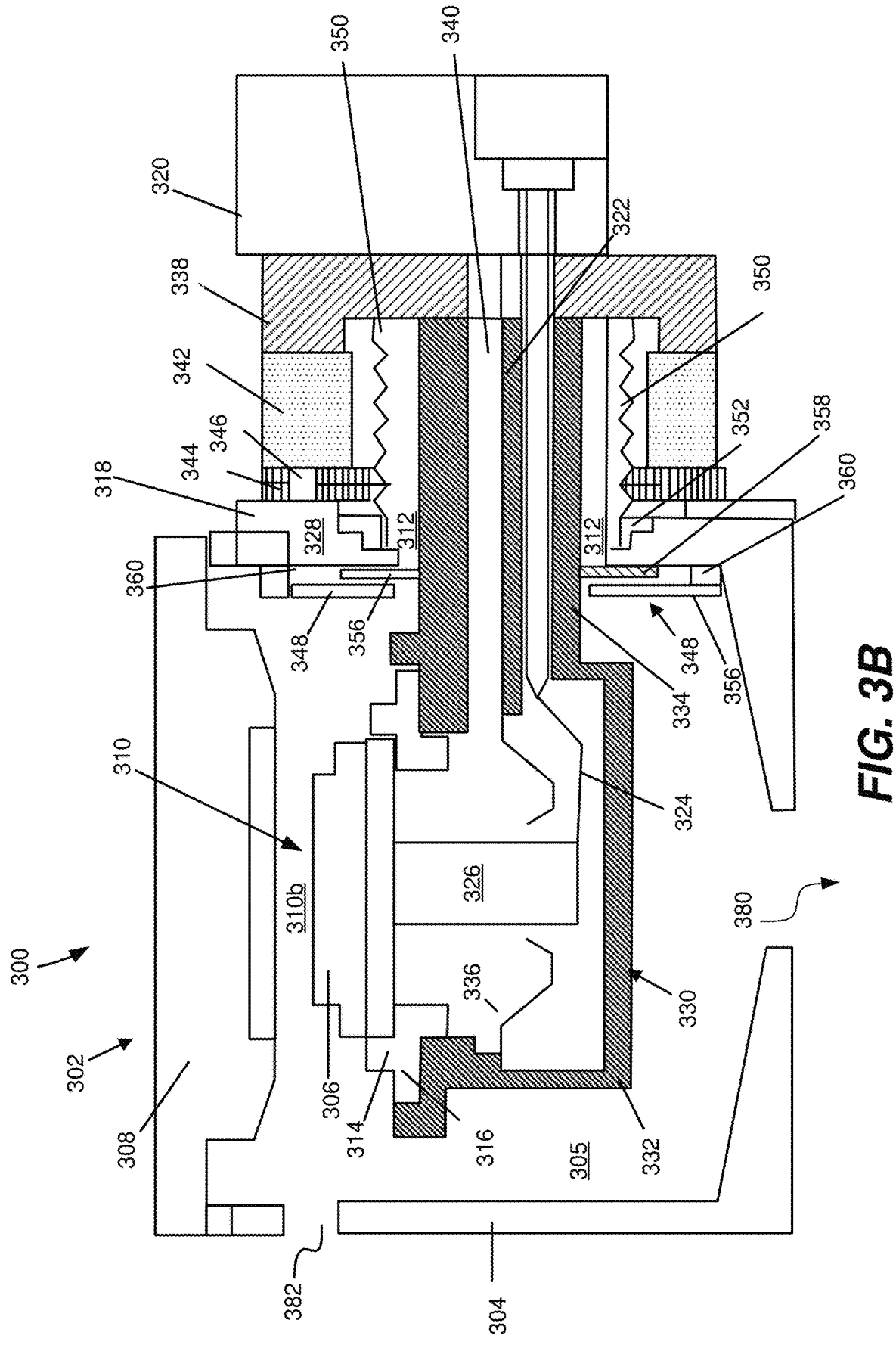
Figure 3C:
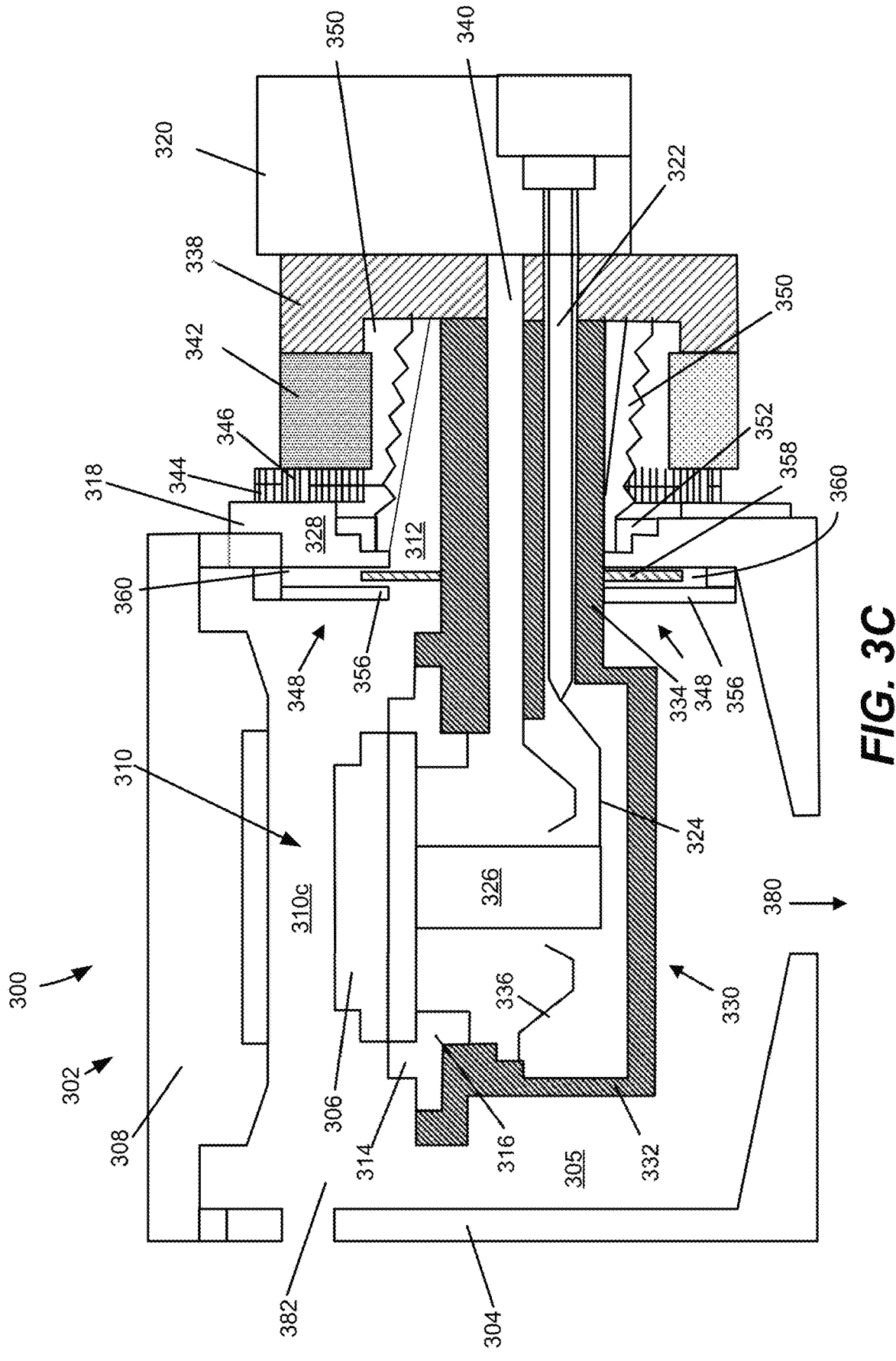

FIGS. 3A-3C illustrate an embodiment of an adjustable gap capacitively coupled confined RF plasma reactor 300 that may be used for performing the etching operations described herein. As depicted, a vacuum chamber 302 includes a chamber housing 304, surrounding an interior space housing a lower electrode 306. In an upper portion of the chamber 302 an upper electrode 308 is vertically spaced apart front the lower electrode 306. Planar surfaces of the upper and lower electrodes 308, 306 are substantially parallel and orthoganol to the vertical direction between the electrodes. Preferably the upper and lower electrodes 308, 306 are circular and coaxial with respect to a vertical axis. A lower surface of the upper electrode 308 faces an upper surface of the lower electrode 306. The spaced apart facing electrode surfaces define an adjustable gap 310 therebetween. During operation, the lower electrode 306 is supplied RF power by an RF power supply (match) 320. RF power is supplied to the lower electrode 306 though an RF supply conduit 322, an RF strap 324 and an RF power member 326. A grounding shield 336 may surround the RF power member 326 to provide a more uniform RF field to the lower electrode 306. As described in commonly-owned U.S. Pat. No. 7,732,728, the entire contents of which are herein incorporated by reference, a wafer is inserted through wafer port 382 and supported in the gap 310 on the lower electrode 306 for processing, a process gas is supplied to the gap 310 and excited into plasma state by the RF power. The upper electrode 308 can be powered or grounded.

In cases where one or more species delivered to the plasma reactor 300 is stored as a liquid, a modified gas delivery system (not shown) may be used. For instance, the modified gas delivery system may include hardware (e.g., bubbler, vaporizer, etc.) for vaporizing a liquid phase species, as well as appropriate plumbing (e.g., high temperature gas lines and valves) and control equipment (e.g., high temperature mass flow controller and/or liquid flow controller) for implementing the reactant delivery.

In the embodiment shown in FIGS. 3A-3C, the lower electrode 306 is supported on a lower electrode support plate 316. An insulator ring 314 interposed between the lower electrode 306 and the lower electrode Support plate 316 insulates the lower electrode 306 from the support plate 316.

An RF bias housing 330 supports the lower electrode 306 on an RE bias housing bowl 332. The bowl 332 is connected through an opening in a chamber wall plate 318 to a conduit support plate 338 by an arm 334 of the RF bias housing 330. In a preferred embodiment, the RF bias housing bowl 332 and RF bias housing arm 334 are integrally formed as one component, however, the arm 334 and bowl 332 can also be two separate components bolted or joined together.

The RF bias housing arm 334 includes one or more hollow passages for passing RE power and facilities, such as gas coolant, liquid coolant, RF energy, cables for lift pin control, electrical monitoring and actuating signals from outside the vacuum chamber 302 to inside the vacuum chamber 302 at a space on the backside of the lower electrode 306. The RF supply conduit 322 is insulated from the RF bias housing arm 334, the RE bias housing arm 334 providing a return path for RE power to the RF power supply 320. A facilities conduit 340 provides a passageway for facility components. Further details of the facility components are described in U.S. Pat. Nos. 5,948,704 and 7,732, 728 and are not shown here for simplicity of description. The gap 310 is preferably surrounded by a confinement ring assembly or shroud (not shown), details of which can be found in commonly owned published U.S. Pat. No. 7,740, 736 herein incorporated by reference. The interior of the vacuum chamber 302 is maintained at a low pressure by connection to a vacuum pump through vacuum portal 380.

The conduit support plate 338 is attached to an actuation mechanism 342. Details of an actuation mechanism are described in commonly-owned U.S. Pat. No. 7,732,728 incorporated herein by above. The actuation mechanism 342, such as a servo mechanical motor, stepper motor or the like is attached to a vertical linear bearing 344, for example, by a screw gear 346 such as a ball screw and motor for rotating the ball screw. During operation to adjust the size of the gap 310, the actuation mechanism 342 travels along the vertical linear bearing 344. FIG. 3A illustrates the arrangement when the actuation mechanism 342 is at a high position on the linear bearing 344 resulting in a small gap 310. FIG. 313 illustrates the arrangement when the actuation mechanism 342 is at a mid position on the linear bearing 344. As shown, the lower electrode 306, the RE bias housing 330, the conduit support plate 338, the RF power supply 320 have all moved lower with respect to the chamber housing 304 and the upper electrode 308, resulting in a medium size gap 310b.

FIG. 3C illustrates a large gap 310c when the actuation mechanism 342 is at a low position on the linear bearing. Preferably, the upper and lower electrodes 308, 306 remain coaxial during the gap adjustment and the facing surfaces of the upper and lower electrodes across the gap remain parallel.

This embodiment allows the gap 310 between the lower and upper electrodes 306, 308 in the CCP chamber 302 during multi-step process recipes (BARC, HARC, and STRIP etc.) to be adjusted, for example, in order to maintain uniform etch across a large diameter substrate such as 300 mm wafers or flat panel displays. In particular, this chamber pertains to a mechanical arrangement that permits the linear motion necessary to provide the adjustable gap between lower and upper electrodes 306, 308.

FIG. 3A illustrates laterally deflected bellows 350 sealed at a proximate end to the conduit support plate 338 and at a distal end to a stepped flange 328 of chamber wall plate 318. The inner diameter of the stepped flange defines an opening 312 in the chamber wall plate 318 through which the RF bias housing arm 334 passes. The distal end of the bellows 350 is clamped by a clamp ring 352.

The laterally deflected bellows 350 provides a vacuum seal while allowing vertical movement of the RF bias housing 330, conduit support plate 338 and actuation mechanism 342. The RF bias housing 330, conduit support plate 338 and actuation mechanism 342 can be referred to as a cantilever assembly. Preferably, the RF power supply 320 moves with the cantilever assembly and can be attached to the conduit support plate 338. FIG. 3B shows the bellows 350 in a neutral position when the cantilever assembly is at a mid position. FIG. 3C shows the bellows 350 laterally deflected when the cantilever assembly is at a low position.

A labyrinth seal 348 provides a particle barrier between the bellows 350 and the interior of the plasma processing chamber housing 304. A fixed shield 356 is immovably attached to the inside inner wall of the chamber housing 304 at the chamber wall plate 318 so as to provide a labyrinth groove 360 (slot) in which a movable shield plate 358 moves vertically to accommodate vertical movement of the cantilever assembly. The outer portion of the movable shield plate 358 remains in the slot at all vertical positions of the lower electrode 306.

In the embodiment shown, the labyrinth seal 348 includes a fixed shield 356 attached to an inner surface of the chamber wall plate 318 at a periphery of the opening 312 in the chamber wall plate 318 defining a labyrinth groove 360. The movable shield plate 358 is attached and extends radially from the RF bias housing arm 334 where the arm 334 passes through the opening 312 in the chamber wall plate 318. The movable shield plate 358 extends into the labyrinth groove 360 while spaced apart from the fixed shield 356 by a first gap and spaced apart from the interior surface of the chamber wall plate 318 by a second gap allowing the cantilevered assembly to move vertically. The labyrinth seal 348 blocks migration of particles spalled from the bellows 350 from entering the vacuum chamber interior 305 and blocks radicals from process gas plasma from migrating to the bellows 350 where the radicals can form deposits which are subsequently spalled.

FIG. 3A shows the movable shield plate 358 at a higher position in the labyrinth groove 360 above the RF bias housing arm 334 when the cantilevered assembly is in a high position (small gap 310a). FIG. 3C shows the movable shield plate 358 at a lower position in the labyrinth groove 360 above the RF bias housing arm 334 when the cantilevered assembly is in a low position (large gap 310c). FIG. 3B shows the movable shield plate 358 in a neutral or mid position within the labyrinth groove 360 when the cantilevered assembly is in a mid position (medium gap 310b).

While the labyrinth seal 348 is shown as symmetrical about the RF bias housing arm 334, in other embodiments the labyrinth seal 348 may be asymmetrical about the RF bias arm 334.

The apparatus shown in FIGS. 3A-3C includes a controller that is configured to perform the methods described herein. In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start anew process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of etching a recessed feature into a material on a substrate in a processing chamber, the method comprising:

(a) flowing a gas mixture into the processing chamber,
      wherein the gas mixture comprises an etch component and a passivation component,
      wherein one or more of the following conditions is satisfied:
         (i) the passivation component comprises an element selected from the group consisting of rhenium, lead, nickel, zinc, gallium, vanadium, germanium, arsenic, antimony, tellurium, selenium, and combinations thereof,
         (ii) the passivation component comprises $Sn(CH_3)_4$ and/or $SnH_4$,
         (iii) the passivation component comprises $MoF_6$ and/or $MoCl_2F_2$, (iv) the passivation component comprises $WOCl_4$, bis(t-butylimido)bis(dimethylamino)tungsten(VI) $(((CH_3)_3CN)_2W(N(CH_3)_2)_2)$, mesitylene tungsten tricarbonyl $(C_6H_3(CH_3)_3W(CO)_3)$, $WOF_4$, $WO_2F_2$, and/or $WO_2Cl_2$, and/or (v) the substrate is positioned on a substrate support during etching, the substrate support is maintained at a temperature of about −10° C. or warmer during etching, and the passivation component comprises an element selected from the group consisting of tin, molybdenum, titanium, tantalum, and combinations thereof;

(b) generating a plasma from the gas mixture in the processing chamber; and (c) exposing the substrate to the plasma and etching the recessed feature into the material on the substrate, wherein the material on the substrate comprises an electrically conductive material, and wherein (c) comprises etching the recessed feature into the electrically conductive material.

2. The method of claim 1, wherein the passivation component is stored as a gas or liquified gas.

3. The method of claim 2, wherein the passivation component is stored as a liquid, the method further comprising vaporizing the passivation component prior to flowing the gas mixture into the processing chamber.

4. The method of claim 1, wherein the etch component and the passivation component are mixed together before delivery to the processing chamber.

5. The method of claim 1, wherein the passivation component comprises a material selected from the group consisting of rhenium, lead, nickel, zinc, gallium, vanadium, germanium, arsenic, antimony, tellurium, and selenium.

6. The method of claim 5, wherein the passivation component comprises rhenium.

7. The method of claim 1, wherein the passivation component comprises $Sn(CH_3)_4$, $SnH_4$, $MoF_6$, $MoCl_2F_2$, $WOCl_4$, bis(t-butylimido)bis(dimethylamino)tungsten(VI) $(((CH_3)_3CN)_2W(N(CH_3)_2)_2)$, mesitylene tungsten tricarbonyl $(C_6H_3(CH_3)_3W(CO)_3)$, $WOF_4$, $WO_2F_2$, $WO_2Cl_2$, $ReF_6$, $PbH_4$, $Pb(C_2H_5)_4$, $Ni(CO)_4$, $Zn(CH_3)_2$, $Ga(CH_3)_3$, $VF_5$, $VOCl_3$ $GeH_4$, $GeF_4$, $Ge(CH_3)_4$, $GeCl_4$, $As(CH_3)_3$, $AsH_3$, $AsCl_3$, $SbH_3$, $SbCl_3$, $SbCl_5$, $H_2Te$, $Se(CH_3)_2$, $SeF_6$, and/or $Se_2Cl_2$.

* * * * *